United States Patent [19]

Neidorff

[11] 4,398,160

[45] Aug. 9, 1983

[54] CURRENT MIRROR CIRCUITS WITH FIELD EFFECT TRANSISTOR FEEDBACK

[75] Inventor: Robert A. Neidorff, Chandler, Ariz.

[73] Assignee: Motorola, Inc., Schaumburg, Ill.

[21] Appl. No.: 357,456

[22] Filed: Mar. 12, 1982

Related U.S. Application Data

[63] Continuation of Ser. No. 206,421, Nov. 13, 1980.

[51] Int. Cl.³ .............................................. H03F 3/04
[52] U.S. Cl. ................................... 330/288; 323/316; 330/257
[58] Field of Search ............... 330/257, 288; 323/315, 323/316; 307/297

[56] References Cited

PUBLICATIONS

Motorola Linear Integrated Circuits, Series C, 1979, MC1403A 1 MC1503A, pp. 4-42-4-47.

Primary Examiner—James B. Mullins
Assistant Examiner—Gene Wan
Attorney, Agent, or Firm—Michael D. Bingham

[57] ABSTRACT

Two current mirror circuits employing a combination of JFET's and bipolar transistors and a high gain amplifier including one of the mirrors are disclosed. The mirrors each include input and output bipolar transistor with a JFET variable current sink circuit connected across the collector-to-base electrodes of one of the bipolar transistors and a JFET constant current supply is connected to the variable current sink. One of the mirrors further includes a bipolar turn-around circuit connected between the constant current supply and the variable current sink to compensate for otherwise possibly undesirable effects of the base currents of the input and output bipolar transistors.

12 Claims, 3 Drawing Figures

CURRENT MIRROR CIRCUITS WITH FIELD EFFECT TRANSISTOR FEEDBACK

This is a continuation of application Ser. No. 206,421, filed on Nov. 13, 1980.

BACKGROUND OF THE INVENTION

1. Field of the Invention

The invention relates to current mirror circuits which provide output currents that are substantially identical in magnitude and direction to input currents. Such current mirrors are used in linear integrated circuits such as differential amplifiers, biasing circuits, regulators and voltage references to provide biasing and loading, for instance.

2. Prior Art

Bipolar current mirror circuits which are suitable for many applications have been developed in the prior art. For example, one such prior art configuration includes an input PNP transistor and an output PNP transistor having emitter electrodes connected to a positive supply conductor and base electrodes which are connected together. A feedback PNP transistor has a base electrode connected to the collector electrode of the input transistor, an emitter electrode connected to the commonly connected base electrodes of the input and output transistors and a collector electrode connected to a negative reference potential conductor. The collector electrode of the input transistor receives an input current and the collector electrode of the output transistor provides the mirrored output current.

Unfortunately, the magnitudes of the input and output currents of the foregoing mirror circuit are not always substantially equal. More specifically, the input current has a magnitude equal to the sum of the collector current of the input transistor and the base current of the feedback transistor. Since the configuration forces the collector currents of the input and output transistors to be equal, the magnitude of the output current differs from the magnitude of the input current by an error current which is equal to the base current of the feedback transistor. The base current of the feedback transistor is a function of the magnitude of the input current, the beta of the input transistor and the beta of the feedback transistor. The betas of the input and feedback transistors vary with temperature and processing. Also the betas of the PNP transistors made with linear processes tend to be quite low and may vary from one to one hundred depending upon the process, geometry, and operating currents. Thus, the magnitude of the error current is difficult to predict and to cancel. Therefore the foregoing prior art circuit is not suitable for some applications requiring precise duplication of the input current by the output current.

Another problem with the above described prior art circuit is that the input terminal of the current mirror is forced to be at a voltage of at least 2 diode drops below the positive power supply conductor voltage because of the series connection of the base-to-emitter junctions of the input and feedback transistors therebetween. This voltage drop limits the amplitude of the driving voltage swing which can occur at the input terminal of the current mirror for a given supply. Thus, the foregoing prior art current mirror circuit is not suitable for some low voltage applications.

Other prior art current mirror configurations also suffer from the above problems.

SUMMARY OF THE INVENTION

One object of the invention is to provide improved current mirror configurations.

Another object of the invention is to provide current mirror configurations that develop output currents which have substantially the same magnitudes as the magnitudes of input currents.

A further object of the invention is to provide current mirror circuits which are suitable for use with low voltage power supplies.

Still another object of the invention is to provide current mirror circuits which fulfill the foregoing objects and which are suitable for being manufactured by present day linear processes.

Briefly, a current mirror in accordance with an exemplary embodiment of the invention includes an input current path having an input bipolar transistor, an output current path having an output bipolar transistor, a variable current sink and a constant current supply. The variable current sink includes a field effect transistor which is connected between the collector and base electrodes of the input bipolar transistor. The output transistor has a base electrode connected to the base electrode of the input transistor. The constant current supply includes a further field effect transistor which is coupled to the variable current sink and provides a quiescent bias current thereto that enables the variable current sink to produce a voltage substantially equal to zero volts between the base and collector of the input transistor to enable low voltage operation.

Under dynamic conditions, the variable current sink field effect transistor draws only a minimal amount of current from the collector of the input transistor and selectively sinks the base currents of both bipolar transistors. The variable current sink field effect transistor enables current and voltage balance to be maintained between the bipolar transistors thereby enabling the instantaneous magnitude of the output current provided to a load from the collector of the output transistor to be substantially equal to the instantaneous magnitude of the input current drawn from the collector of the input transistor by a driving circuit connected thereto.

DETAILED DESCRIPTION OF THE PREFERRED EMBODIMENTS

Figure 1:
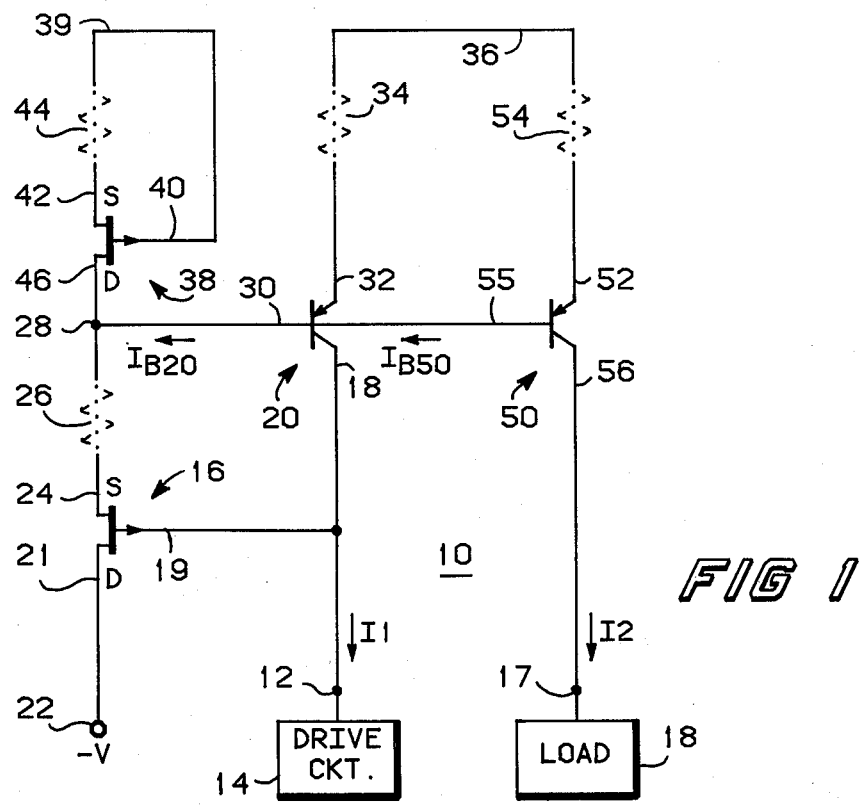
FIG. 1 is a schematic diagram of a current mirror circuit of one embodiment of the invention.

FIG. 1 is a schematic diagram of current mirror 10 having an input terminal 12 which is connected to a current drive circuit 14 and an output terminal 17 which is connected to an electrical load 18. Circuit 10 provides an output current at terminal 17 which has an instanteous magnitude that is substantially equal to the instantaneous magnitude of the current sinked from terminal 12 by drive circuit 14.

Input terminal 12 is also connected to gate electrode 19 of P-channel junction field effect transistor (JFET) 16 for providing control signals thereto and to the collector electrode 18 of PNP transistor 20. Variable current sink JFET 16 has a drain electrode 21 which is connected to negative supply terminal or conductor 22 and a source electrode 24 which is coupled through resistor 26 to node 28. PNP input current path bipolar transistor 20 has a base electrode 30 which is connected to node 28 and an emitter electrode 32 which is coupled through resistor 34 to a first positive power supply terminal or conductor 36.

Constant current source P-channel JFET 38 includes a gate electrode 40 which is connected to a second positive power supply conductor 39, a source electrode 42 which is coupled through resistor 44 to supply conductor 39 and a drain electrode 46 which is connected to node 28. JFETs 16, 38 have matched electrical parameters and resistors 26, 44 have matched electrical parameters. PNP output path transistor 50 includes an emitter electrode 52 coupled through resistor 54 to power supply conductor 36, a base electrode 55 connected to base electrode 30 of transistor 20 and collector electrode 56 which is connected to output terminal 17 of current mirror 10. PNP transistors 20, 50 have matched electrical parameters and resistors 34, 54 have matched electrical parameters. All corresponding pairs of resistors of mirror 10 are optional.

QUIESCENT OPERATION OF MIRROR 10

Under quiescent conditions the current coming into source 24 of JFET 16 is equal to the current coming out of the drain of JFET 38 plus the base currents of transistors 20 and 50. A negative feedback, field effect transistor current supply including components similar to 38 and 44 is disclosed by U.S. Pat. No. 4,053,915, entitled, "Temperature Compensated Current Source Device," (Ser. No. 669,065) which is assigned to the assignee hereof. Because of back biasing by resistor 44 the magnitude of the constant current sourced by the drain of JFET 38 is less than the maximum value of the current, $I_{DSS}$ which would otherwise be provided by JFET 38. If the value of resistor 44 is assumed to be zero, then the current sourced by transistor 38 is $I_{DSS}$. Assuming that resistor 26 is also zero ohms. JFET 16 will operate at only a very slightly higher current than JFET 38 because it must also sink the base currents, $I_{B20}$ and $I_{B50}$ of transistors 20 and 50. If these base currents have small magnitudes, then JFET 16 operates at near $I_{DSS}$ and therefore its gate-to-source potential is near zero volts. Consequently, the collector-to-base voltage of transistor 20 is also about equal to zero volts. If resistors 34 and 54 also have zero resistance then input terminal 12 is only one diode drop below the potential on positive supply conductor 36 to facilitate low supply voltage operation.

Typically the values of all the resistors of circuit 10 are geometry dependent and will be in the range between 1 to 20 Kilohms. The magnitudes of the quiescent currents of JFETs 16 and 38 are inversely proportional to the values of the resistors, 44, 26. Typically these currents are in the range of 25 to 50 microamps at which resistors 44, 26 have values of about 10 kilohms. The quiescent collector currents of transistors 20 and 50 can have magnitudes different from the magnitudes of the currents through JFETs 16 and 38. If resistors 34, 54 also have resistances of 10 kilohm, and transistors 20, 50 conduct quiescent collector currents of twice the current conducted by JFETs 16, 38 the quiescent voltage drop across resistors 34 and 54 can be 100 millivolts whereas the voltage across resistors 44 and 26 can be 200 millivolts, for instance. Other types of field effect devices can be used in place of JFET's 38 and 16. More particularly, transistors 38 and 16 could be replaced by depletion mode MOSFET's.

DYNAMIC OPERATION OF MIRROR 10

In dynamic operation, assume that driver circuit 14 attempts to lower the potential at input node 12, by drawing or sinking current therefrom, for instance. Consequently, the potential at gate 19 of JFET 16 is lowered. JFET 16 is operated in a non-inverting source-follower mode so that lowering the potential at the gate of JFET 16 results in a lowering of the potential at the source 24 of JFET 16. JFET 16 has virtually infinite current gain and input impedance. As the potential on the source of transistor 16 is lowered, the potential on the bases of transistors 20 and 50 is also pulled in a more negative direction by source 24 of JFET 16. Consequently, transistors 20 and 50 are rendered equally more conductive. Thus JFET 16 provides a feedback function. When the collector current of transistor 20 becomes substantially equal to the magnitude of the current drawn or sinked by driver circuit 14, the base currents of transistors 20 and 50 will be equally sinked by variable sink JFET 16 and the gate voltage of JFET 16 will stabilize. Gate 19 of JFET 16 draws only minimal current from collector 18 caused by junction reverse bias leakage. Thus, the driver current is substantially equal in magnitude to the collector current of transistor 20 and the output current is equal in magnitude to the collector current of transistor 50. Since transistor 20 and 50 have the equal base-to-emitter voltages and equal base currents, the load current is substantially equal in magnitude to the driver current.

Although circuit 10 of FIG. 1 is useful for many applications requiring precise "mirroring" of the input and output current magnitudes, it suffers from the problem that the current through JFET 16 differs from the current through JFET 38 by an error current equal to the base currents of transistors 20 and 50. Thus the collector-to-base voltage of transistor 20 may not be substantially equal to zero. It is desirable for the base-to-collector voltage of transistor 20 to be as near zero as possible so that circuit 10 can operate at low supply voltages, transistor 20 doesn't saturate, and load 18 can be designed to operate at about a diode drop below the voltage applied to conductor 36. Circuit 10 is most useful when transistors 20 and 50 have high betas or the magnitude of the input and output currents are small, which minimizes the magnitude of the error current.

Figure 2:
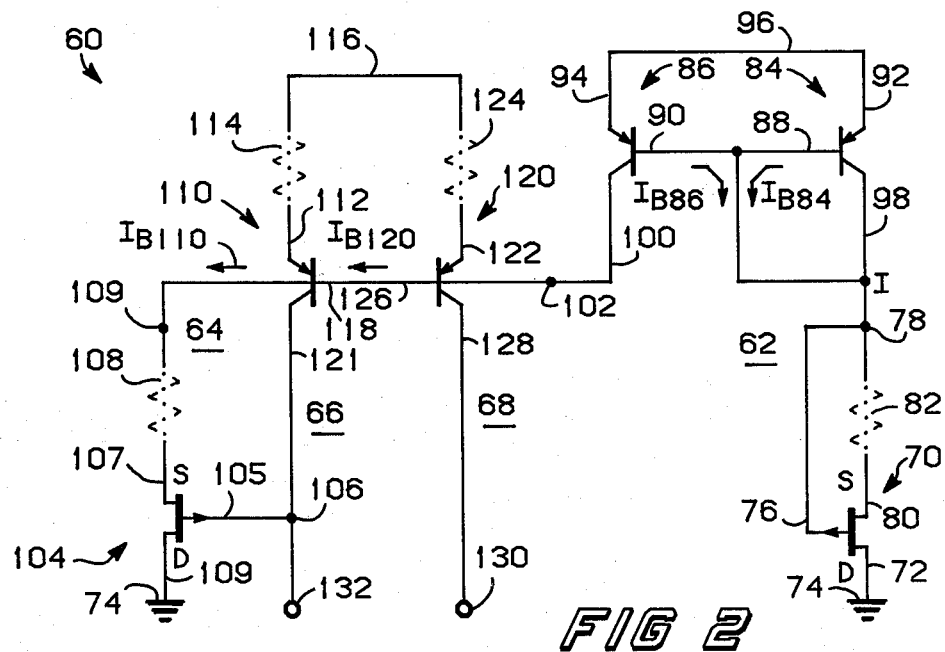
FIG. 2 is a schematic diagram of a current mirror of another embodiment of the invention.

In FIG. 2 a further embodiment of a current mirror 60 of the invention is illustrated which solves the above problem of current mirror 10 for most practical purposes. Current mirror 60 includes a constant current source or supply 62, a variable current sink 64, an input current path 66, and an output current path 68. Constant current source 62 includes P-channel JFET 70 having a drain electrode 72 connected to a ground or reference potential conductor 74, a gate electrode 76 connected to junction 78, and a source electrode 80 coupled through optional resistor 82 to junction 78.

Bipolar transistors 84 and 86 form a current mirror which duplicates the current sourced by JFET 70 minus the two base currents $I_{B84}$ and $I_{B86}$ of transistors 84 and 86. Transistors 84 and 86 have respective base electrodes 88 and 90 connected together and respective emitter electrodes 92 and 94 which are each connected to a first power supply conductor 96. Collector electrode 98 of transistor 84 is connected to base electrode 88 and to junction 78. Collector electrode 100 of transistor 86 is connected to current source output terminal 102 and sources a bias current through terminal 102 having a constant magnitude equal to the magnitude of the current conducted by JFET 70 minus the base currents of transistors 84 and 86.

Variable current sink 64 includes p-channel JFET 104 having drain electrode 109 connected to ground or reference potential 74, gate electrode 105 connected to circuit node 106 and source electrode 107 coupled through optional resistor 108 to current source output terminal 102. Input current path 66 of current mirror 60 includes PNP transistor 110 having an emitter electrode 112 coupled through optional resistor 114 to a second positive power supply conductor 116, a base electrode 118 connected to end 109 of resistor 108 and to terminal 102 and a collector electrode 121 connected to node 106. Output current path 68 of current mirror 60 includes another PNP transistor 120 having an emitter electrode 122 coupled through optional resistor 124 to the power supply conductor 116, a base electrode 126 connected to base electrode 118 and a collector electrode 128 connected to output terminal 130. Input terminal 132 of current mirror 60 is connected to node 106.

QUIESCENT OPERATION OF MIRROR 60

Under quiescent conditions it is desired that the collector-to-base voltage of transistor 110 be kept at a low value, as previously mentioned. Thus the voltage between the gate electrode 105 of JFET 104 and terminal 109 of resistor 108 must be minimized. Therefore, the voltage drop between the gate and source of JFET 104 should cancel the voltage drop across resistor 108. To accomplish this result, it is desirable to control the quiescent current through JFET 104 and to respectively match JFET 70 to JEFT 104 and resistor 82 to resistor 108. Thus constant current source 62 is arranged to provide a current through terminal 102 equal to the desired current of JFET 70 minus the base currents of transistors 84 and 86. The base currents $I_{B110}$ and $I_{B120}$ of transistors 110 and 120 are then added to the current at terminal 102 to provide a composite current which is sinked by JFET 104. In this manner, assuming that transistors 110, 120 and 84, 86 are matched and running at approximately the same quiescent currents, the current through JFET 104 becomes substantially equal to the current through JFET 70 and the collector-to-base voltage of transistor 110 is maintained at a near zero value.

DYNAMIC OPERATION OF MIRROR 60

Under dynamic conditions, the magnitude of the maximum current sourced by a load from output terminal 130 is desired to be instantaneously equal to the magnitude of the current drawn from input terminal 132 by a driver circuit. As the voltage at terminal 132 decreases, p-channel JFET 104 is rendered more conductive to the extent necessary to sink the required base currents from transistors 110 and 120. This results in tracking of the base-to-emitter voltages and base currents of transistors 110 and 120 which causes the current delivered at output terminal 130 to have a magnitude which is substantially equal to the magnitude of the current drawn from terminal 132 by the driving circuit. Resistors 114 and 124 can have equal values and provide negative feedback for aiding matched transistors 110 and 120 to have the same electrical characteristics.

The gate current of JFET 104 is substantially zero because of the high gain thereof and does not change in a deleterious manner with temperature and voltage. Thus the characteristics of JFET 104 enable the magnitudes of the input current and the output current to be very precisely matched and to compensate for the differences in output impedances of transistors 110 and 120 which can result from collectors 121 and 128 being connected to different impedances. As previously explained with respect to resistors 26 and 44 of FIG. 1, resistors 82 and 108 of FIG. 2 can be eliminated from circuit 60 if it is desired to operate JFET's 70 and 104 at zero gate-to-source voltage and at currents of $I_{DSS}$. The geometries of transistors 110 and 120 can be ratioed in a known manner so that transistor 120 provides a current which is a known multiple or fraction of the current of transistor 110.

HIGH GAIN AMPLIFIER 140

Figure 3:
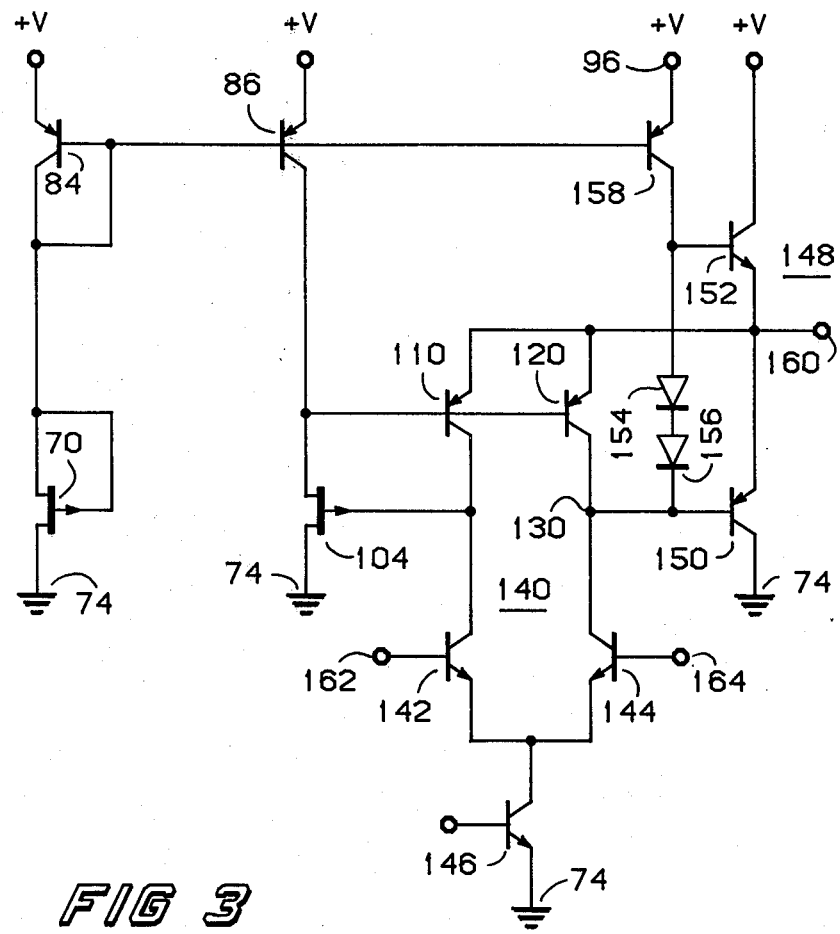
FIG. 3 is a schematic diagram of a high gain differential amplifier which utilizes the current mirror of FIG. 2.

FIG. 3 is a schematic diagram of a typical application of current mirror 60 of FIG. 2. The components in FIG. 3 which have previously been described with respect to FIG. 2, have the same reference numerals as in FIG. 2. High gain amplifier 140 includes differentially connected NPN transistors 142 and 144 which have common emitter electrodes connected to current sink transistor 146. An output stage 148 includes complementary PNP output transistor 150 and an NPN output transistor 152 which are biased by diodes 154 and 156 connected in series between the bases thereof. Current supply PNP transistor 158 provides bias current through its collector which is connected to biasing diodes 154, 156 to prevent crossover distortion in a known manner. Output terminal 160 is connected to the emitter electrodes of transistors 110 and 120.

In operation, if a positive input voltage is applied to non-inverting input terminal 162 and inverting input terminal 164 is connected to receive a reference potential, transistor 142 is rendered increasingly more conductive thereby causing the collector voltage thereof to decrease. As a result, feedback JFET 104 is rendered more conductive and sinks more base current from transistors 110 and 120. The increase in current delivered to node 130 by transistor 120 results in a decrease in conductivity of output transistor 150 and an increase in conductivity of complementary transistor 152. Thus, the signal potential at output terminal 160 tends to increase. The constant current source or supply including transistors 70, 84, and 86 enables variable current sink transistor 104 to operate at $I_{DSS}$ under quiescent conditions so that zero volts is provided across the collector-to-base junctions of transistors 110 and 120. Thus amplifier 140 operates with minimal power supply voltages due to the small voltage drop across the collector-to-base junction of transistors 110 and 120. The high input impedance of JFET 104 enables the current mirrored by transistor 120 to more substantially have the same magnitude as the current conducted by transistor 110 than with known prior art configurations.

Since the base-to-collector voltage of transistor 110 is zero, the gate voltage of JFET 104 is equal to the voltage at node 130, which is one emitter-to-base drop below terminal 160. Thus, transistors 142 and 144 have substantially identical quiescent collector voltages. Also transistors 110 and 120 have identical quiescent collector voltages. This condition facilitates minimal offset voltage between input terminals 162 and 164 and other desirable electrical characteristics.

What has been described are improved current mirror circuits utilizing bipolar transistors in combination with JFET's which are suitable for being manufactured by present day linear integrated circuit processes. Current mirror 10 of FIG. 1 enables the input and output currents to have the same magnitudes. Current mirror 60 of FIG. 2 provides the foregoing advantage along with providing lower voltage operation in some applications. FIG. 3 illustrates one application of current mirror 60 in high gain amplifier 140. Many other applications will be apparent to those skilled in the art.

I claim:

1. A current mirror circuit for providing an output current having the same magnitude as a drive current, including in combination:
   constant current supply means having an output terminal;
   variable current sink means having an input terminal and a control terminal, said input terminal being coupled to said output terminal of said constant current supply means, said control terminal being adapted to receive a drive signal which has a magnitude related to the magnitude of the drive current, and said variable current sink means providing a quiescent voltage having a substantially zero magnitude between said input and control terminals thereof;
   input current path means having an output terminal and a control terminal, said output terminal of said input current path means being coupled to said control terminal of said variable current sink means, and said control terminal of said input current path means being coupled to said input terminal of said variable current sink means; and
   output current path means having a control terminal and an output terminal, said control terminal of said output current path means being coupled to said input terminal of said variable current sink means, and said output terminal of said output current path means being adapted to provide the output current to an electrical load, said variable current sink means selectively sinking the control currents of said input and output current path means in response to said drive signal to enable the output current to have substantially the same magnitude as the drive current.

2. The current mirror circuit of claim 1 wherein said constant current supply means includes a field effect device adapted to provide a bias current which enables said variable current sink means to provide said quiescent voltage having a substantially zero magnitude between said input and control terminals of said variable current sink means.

3. The current mirror circuit of claim 2 wherein:
   said input current path means includes a bipolar transistor having emitter, base and collector electrodes, said base and collector electrodes respectively being coupled to said control and output terminals; and
   said variable current sink means includes a field effect device which is biased by said constant current supply means to provide a substantially zero quiescent voltage between said base and collector electrodes of said bipolar transistor of said input current path means.

4. The current mirror circuit of claim 3 wherein said output current path means includes another bipolar transistor having emitter, base and collector electrodes, said base and collector electrodes of said other transistor being respectively coupled to said control and output terminals of output current path means.

5. The current mirror circuit of claim 2 wherein said constant current supply means includes a bipolar current mirror.

6. A current mirror circuit for providing a minimal voltage drop between a supply conductor and an input terminal thereof to facilitate operation with low voltage power supplies including in combination:
   an input current path having a first bipolar transistor having an emitter electrode, a base electrode and a collector electrode;
   an output current path including a second bipolar transistor having an emitter electrode, a base electrode and a collector electrode, said collector electrode of said second bipolar transistor providing an output terminal for the current mirror circuit;
   constant current supply means having an output terminal coupled to the base electrodes of both bipolar transistors;
   variable current sink means including a field effect transistor having a gate electrode coupled to both said collector electrode of said first bipolar transistor and to the input terminal of the current mirror circuit, and a first main electrode coupled to said base electrode of said first bipolar transistor and to said output terminal of said constant current supply means, said field effect transistor being responsive to a current provided thereto by said constant current supply to enable a base-to-collector voltage across said first bipolar transistor having a magnitude of substantially zero volts to facilitate the low voltage operation.

7. The current mirror circuit of claim 6 wherein:
   first and second differentially connected bipolar transistors each having emitter, base and collector electrodes, said collector electrode of one of said differentially connected transistors being connected to said input terminal of said current mirror circuit and said collector electrode of the other differentially connected transistor being connected to said output terminal of said current mirror circuit.

8. The current mirror of claim 6 wherein said constant current supply means includes a further field effect transistor which is biased to source a current having a magnitude which enables said variable current sink field effect transistor to provide a base-to-collector voltage between said base and collector electrodes said first bipolar transistor having a magnitude of substantially zero volts.

9. The current mirror circuit of claim 8 wherein said constant current supply means further includes:
   a third bipolar transistor having emitter and collector electrodes connected in series with said further field effect transistor and a base electrode connected to the collector electrode thereof; and
   a fourth bipolar transistor having a base electrode connected to said base electrode of said third bipolar transistor, and a collector electrode coupled to said field effect transistor of said variable current sink means, said third and fourth bipolar transistors forming a bipolar current mirror which provides an output current which has a magnitude less than the current conducted by said further field effect transistor by the base currents of said third and fourth bipolar transistors, said first and second bipolar transistors contributing the base currents thereof to the output current of said bipolar current mirror so that said field effect transistor of said variable current sink means operates at substantially the same quiescent current magnitude as said further field effect transistor.

10. The current mirror circuit of claim 8 wherein:

said variable current sink means includes a first junction field effect transistor having source, gate and drain electrodes; and said constant current supply means includes a further junction field effect transistor having source, gate and drain electrodes, said further junction field effect transistor having electrical characteristics which are substantially matched to the electrical characteristics of said first junction field effect transistor.

11. The current mirror circuit of claim 10 wherein a resistor is coupled in series with the source electrode of each of said junction field effect transistors.

12. The current mirror circuit of claim 1 wherein said variable current sink means includes a field effect device for providing said quiescent voltage.

* * * * *